United States Patent [19]
Poi et al.

[11] Patent Number: 6,164,998
[45] Date of Patent: Dec. 26, 2000

[54] ELECTRICAL CONNECTOR HAVING A LATCHING DEVICE

[75] Inventors: Lie-Ming Poi; Yu-San Hsiao, both of Tu-Chen, Taiwan

[73] Assignee: Hon Hai Precision Ind. Co., Ltd., Taipei Shien, Taiwan

[21] Appl. No.: 09/203,812

[22] Filed: Dec. 1, 1998

[30] Foreign Application Priority Data

Dec. 1, 1997 [TW] Taiwan .................................. 86220095

[51] Int. Cl.$^7$ .................................................. H01R 13/62
[52] U.S. Cl. ............................................ 439/326; 439/328
[58] Field of Search .................................... 439/326, 325, 439/327, 328, 329, 629, 630, 541.5

[56] References Cited

U.S. PATENT DOCUMENTS

| | | | |
|---|---|---|---|
| 5,755,585 | 5/1998 | Cheng et al. | 439/326 |
| 6,042,411 | 3/2000 | Choy | 439/328 |

*Primary Examiner*—Brian Sircus
*Assistant Examiner*—Chandrika Prasad
*Attorney, Agent, or Firm*—Wei Te Chung

[57] ABSTRACT

An electrical connector includes an elongate housing and a latching device attached to each end thereof. The latching device includes a plastic retaining member integrally formed with the housing and a metal release member assembled to the retaining member. A daughter board engages with a slot defined in the housing and is rotated downward whereby resilient portions of the retaining member move outward until the daughter board is fully received in the slot. To disengage the daughter board from the connector an outward force is exerted on release pads of the release member. The resilient portions are moved outward to abut against corresponding first stoppers formed on the retaining member. At this position, an embossment extending from each retaining member will abut against a corresponding second stopper of the release member. The provision of the stoppers effectively prevents breakage of the resilient portions while disengaging a daughter board from the connector.

18 Claims, 8 Drawing Sheets

ELECTRICAL CONNECTOR HAVING A LATCHING DEVICE

BACKGROUND OF THE INVENTION

1. Field of the Invention

The present invention relates to an electrical connector for receiving a printed circuit board, and more particularly to an electrical connector having a latching device for releasably securing the printed circuit board.

2. The Prior Art

In order to facilitate insertion of a daughter board into a slot of a connector, front portions of terminals within the slot are specially designed such that the daughter board encounters zero force during insertion. In general, the front portions of the terminals are cantilevered and can be biased. Conductors of the daughter board are electrically and mechanically connected with the terminals after the daughter board is inserted and rotated to engage with the connector. Not only can the daughter board be easily inserted, but the height of the daughter board and connector will also be reduced. However, during rotation, the front portions of the terminals are pushed away from their original positions and the resulting biasing force tends to push the daughter board away therefrom. Thus, the daughter board must be locked with respect to the connector to prevent disengagement between the conductors and the front portions of the terminals.

Latching mechanisms have been developed to retain daughter boards in place in a connector housing. Such latching mechanisms are typically either directly formed in the structure of the connector housing at opposite ends thereof, or they may be separately formed and inserted into the connector housing. Latches integrally formed with the housing do not provide an adequate retention force. Latches formed from a metal strip provide an excellent retention force but manufacturing costs are increased. U.S. Pat. Nos. 4,986,765, 5,514,002, and 5,632,640 disclose pertinent designs.

Hybrid latches, made from both plastic and metal material, are introduced to address the above mentioned drawbacks. Taiwan Patent Nos. 81102107, 81400686, 84100813 and U.S. Pat. Nos. 4,986,765, 5,004,429, 5,145, 396, 5,514,002, 5,632,640 disclose connectors having hybrid latches. An integrally formed plastic portion is used to retain a clipping portion of the daughter board and a metal portion is used to release the daughter board from the plastic portion. The metal portion is separated from the housing. However, even though such latches provide improved resilience and strength, the plastic portion tends to break when an excess force is exerted thereon.

In order to prevent the plastic portion from breaking, the housing is provided with a stopper to limit movement of the plastic portion. This inevitably increases the length of the connector and hinders the compactness thereof. In addition, plastic stoppers are not durable thereby hindering resilience of the plastic portion. Furthermore, in locking or releasing the daughter board, the hybrid latches are pushed away from their original positions. The plastic portion often breaks during this stage because a junction between the plastic portion and the housing experiences a concentration of stress. The junction is a curved plane without any reinforced member mounted thereon.

Hence, an improved electrical connector is needed to overcome the disadvantages of the prior art.

SUMMARY OF THE INVENTION

Accordingly, an objective of the present invention is to provide a connector with latches formed from both metal and plastic and having excellent resilience, the metal portions featuring a simple configuration for facilitating assembly to a housing of the connector whereby a daughter board can be secured to the housing.

Another objective of the present invention is to provide a connector having a stopper integrally formed on metal portions of latches thereof for limiting the outward movement of the latches.

A further objective of the present invention is to provide a connector having latches wherein the latches are reinforced whereby risk of breakage thereof is greatly reduced.

To fulfill the above mentioned objective, an electrical connector in accordance with the present invention includes an elongate housing and a latching device attached to each end thereof. The latching device includes a plastic retaining member integrally formed with the housing and a metal release member assembled to the retaining member. A daughter board defining cutouts in opposite lateral edges thereof is engaged with the housing by inserting a front edge thereof into a slot defined therein and rotated downward whereby each cutout slides along a retainer causing resilient portions of the retaining member to move outward until the daughter board is fully received in the slot. To disengage the daughter board from the connector an outward force is exerted on release pads of the release member. The resilient portions can be moved outward to abut against corresponding first stoppers formed on the retaining member. At this position, an embossment extending from each retainer will abut against a corresponding second stopper formed on the release member. The provision of the stoppers effectively prevents breakage of the resilient portions while disengaging a daughter board from the connector.

These and additional objects, features, and advantages of the present invention will become apparent after reading the following detailed description of the preferred embodiments of the present invention taken in conjunction with the appended drawing figures.

DETAILED DESCRIPTION OF THE PREFERRED EMBODIMENTS

Reference will be made in detail to the preferred embodiments of the present invention. For facilitating understanding, like components are designated by like numerals throughout the different embodiments described herein.

Figure 1:
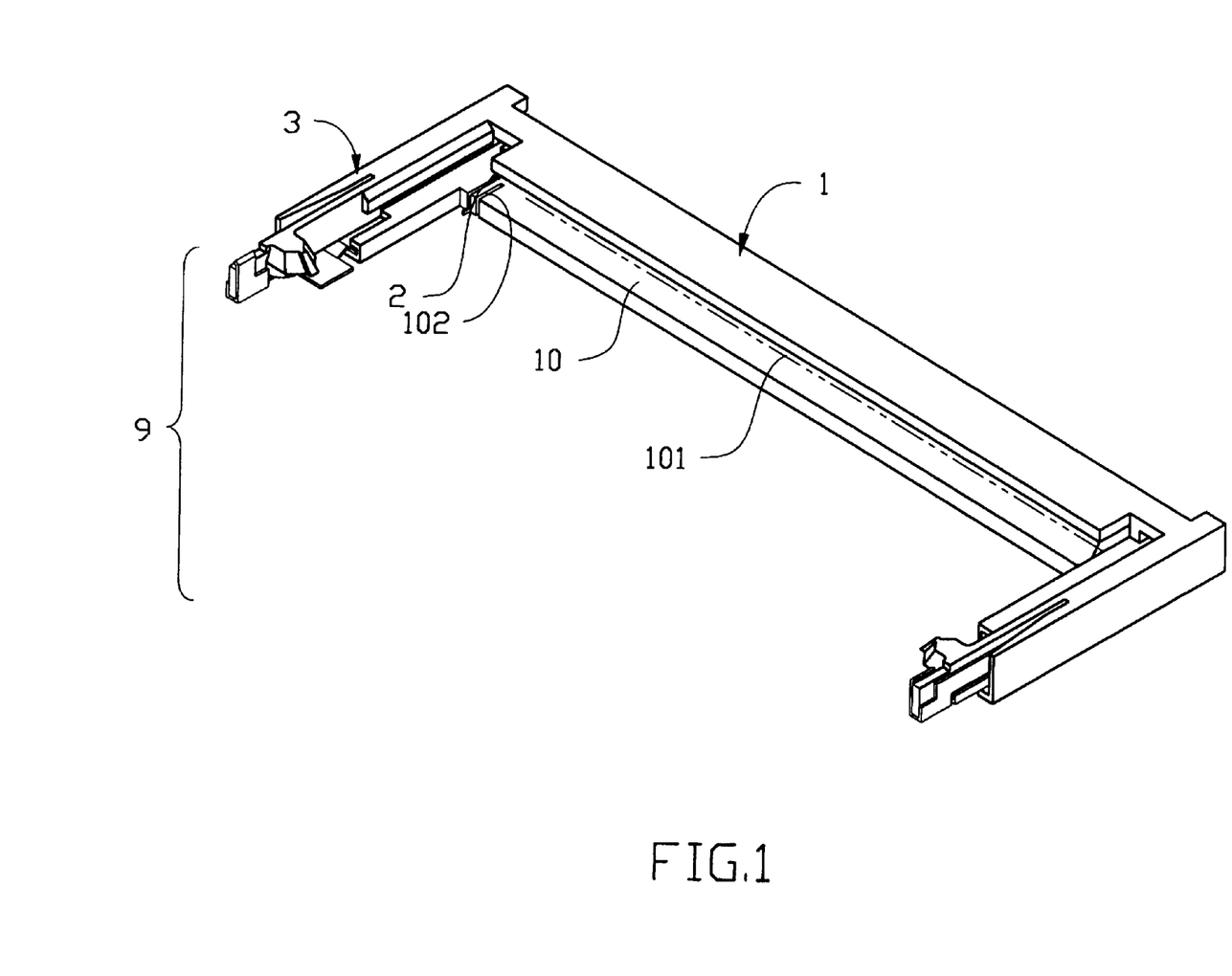
FIG. 1 is a perspective view of an electrical connector in accordance with a preferred embodiment of the present invention.

An electrical connector 9 in accordance with a preferred embodiment of the present invention is shown in FIG. 1 and includes an elongate housing 1, a plurality of terminals 2 received in passageways 102 defined in the housing 1, and a latching device 3 attached to each end of the housing 1. The housing 1 has a mating face 10 with a slot 101 defined therein.

Figure 2A:
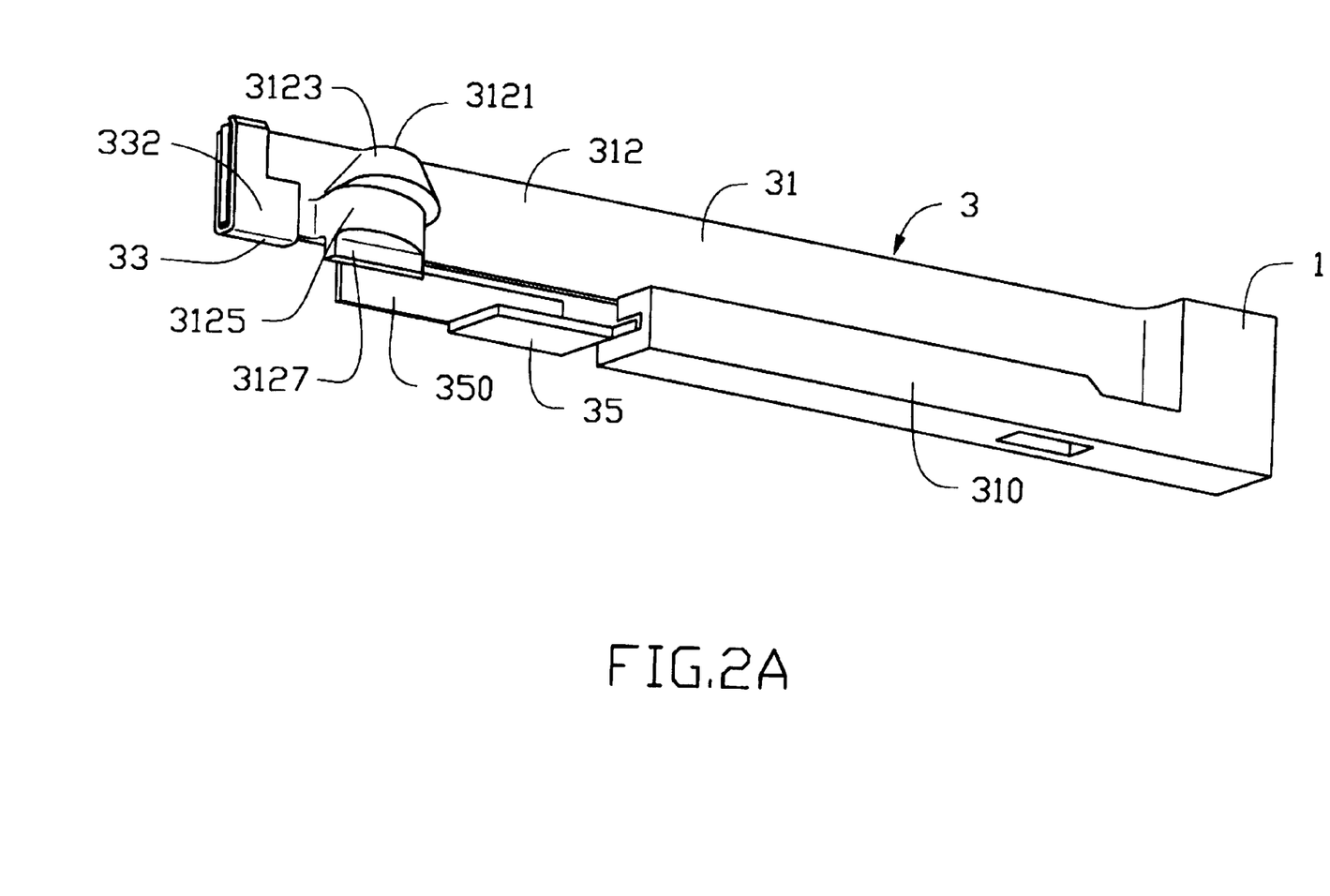
FIG. 2A is a perspective view of a latching device used with the connector of FIG. 1.
Figure 2B:
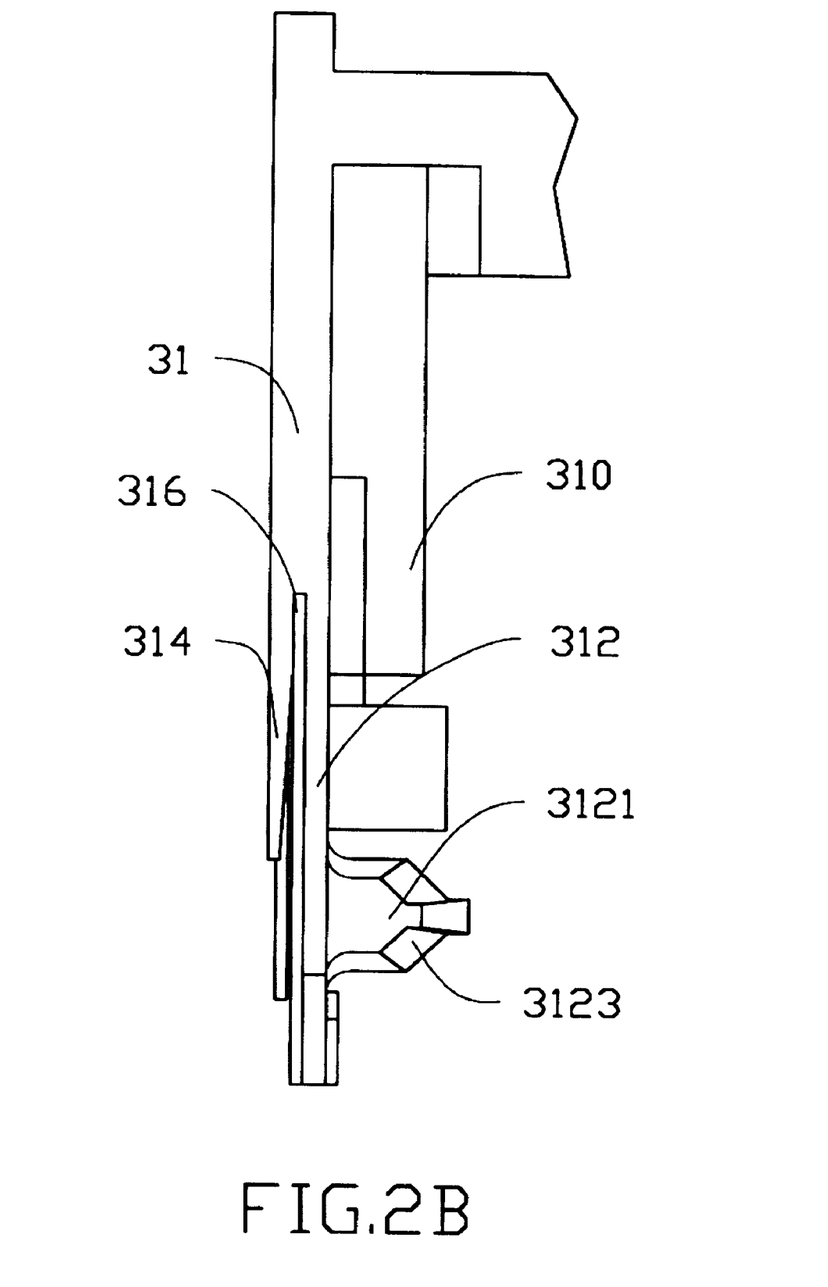
FIG. 2B is a top view of FIG. 2A.

The latching device 3, clearly shown in FIGS. 2A and 2B, includes a plastic retaining member 31 integrally formed with the housing 1 and a metal release member 33 assembled to the retaining member 31. The retaining member 31 comprises a horizontal supporting arm 310, a vertical resilient portion 312, and a first stopper 314. The resiliency of the resilient portion 312 is provided by a groove 316 defined in the retaining member 31 between the resilient portion 312 and the first stopper 314. A retainer 3121 having an outer inclined surface 3123 is formed on an inner surface of the resilient portion 312. A curved wall 3125 is formed below the retainer and an embossment 3127 downwardly extends from a bottom portion of the curved wall 3125.

Figure 3:
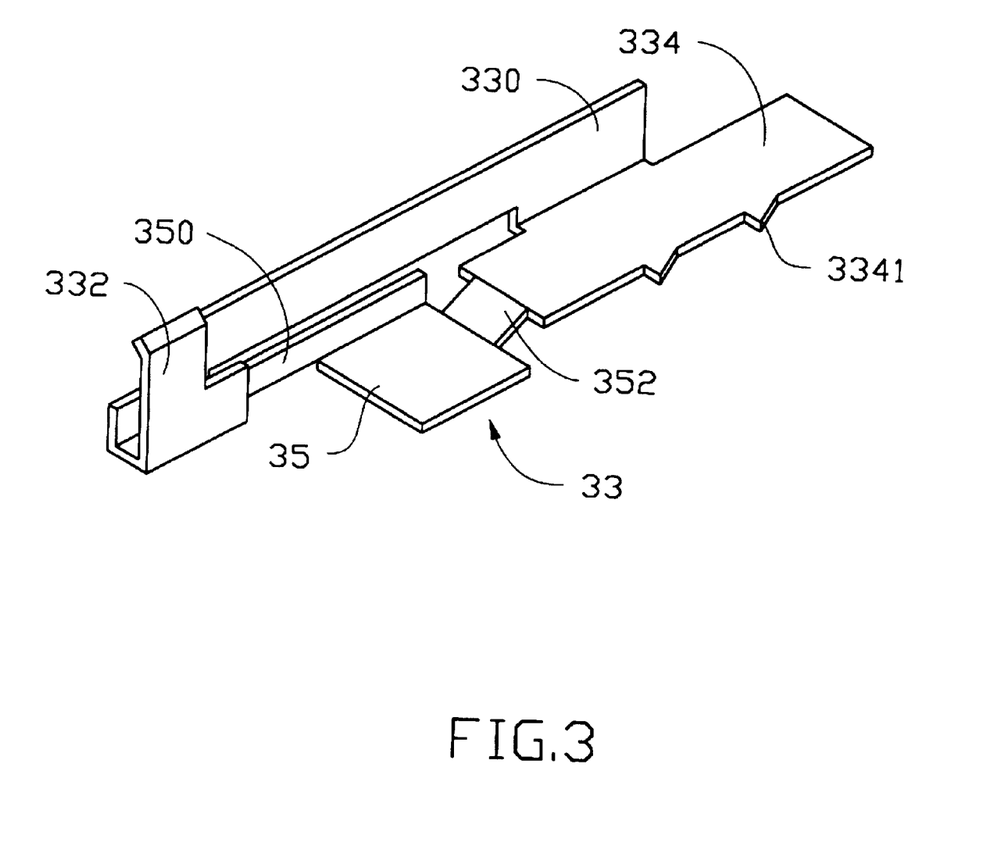
FIG. 3 is a perspective view of a release member used with the connector of FIG. 1.

Also referring to FIG. 3, the release member 33 includes an elongate base 330 with an L-shaped release pad 332 extending from one end thereof and a reception plate 334 perpendicularly extending from an opposite end thereof. The reception plate 334 has barbs 3341 formed on an edge thereof. A positioning member 35 is connected to the reception plate 334 by an inclined plate 352. A second stopper 350 extends from the positioning member 35.

When the release member 33 is assembled to the retaining member 31, the reception plate 334 is received in a channel (not shown) defined in the retaining member 31 and secured therein due to the barbs 3341 engaging with recesses (not shown). The base 330 of the release member 33 abuts against an outer surface of the retaining member 31 and the release pad 332 of the release member 33 encloses a free end of the retaining member 31.

Figure 4A:
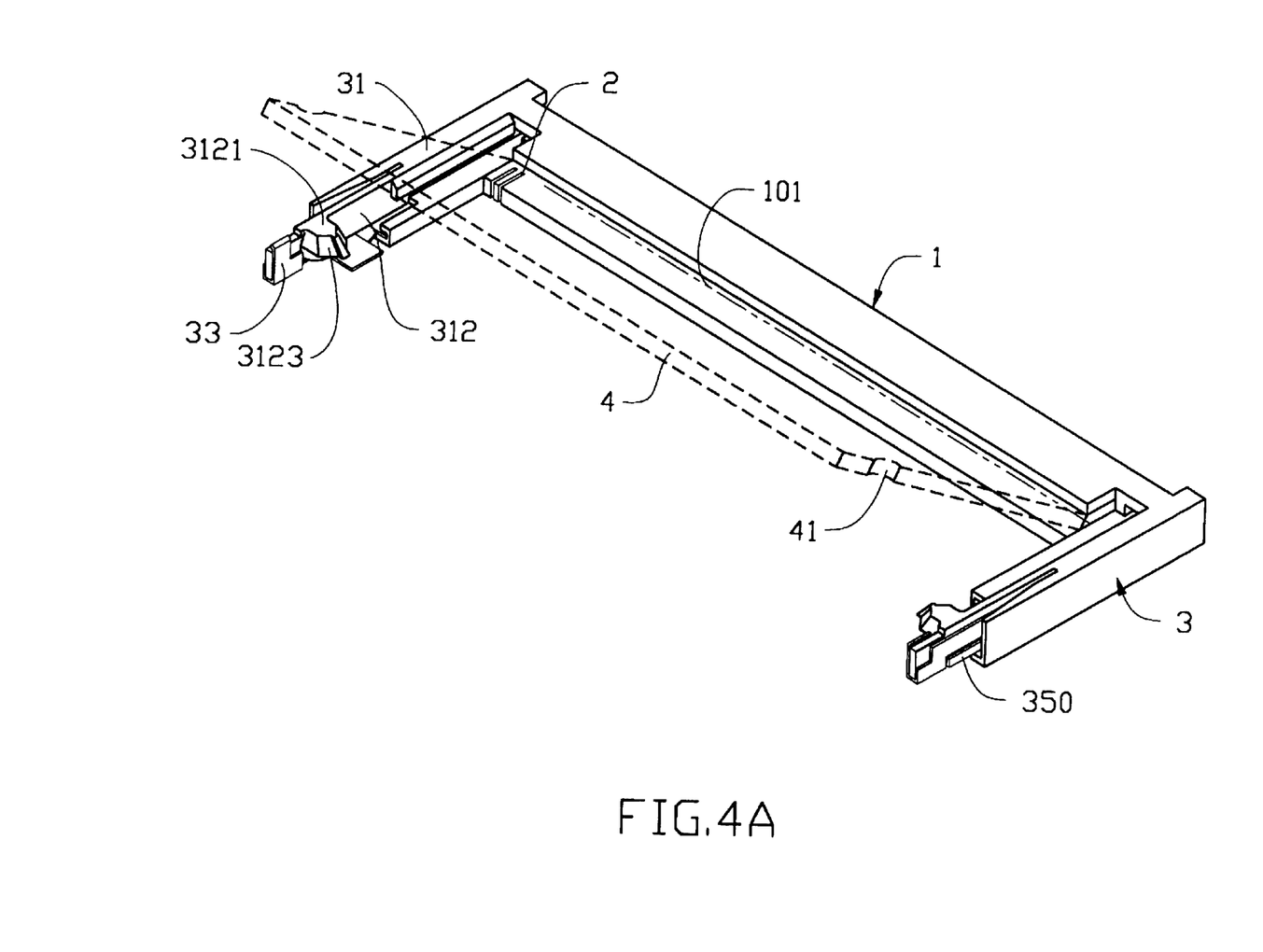
FIG. 4A is an perspective view of a card being inserted into the connector of FIG. 1.
Figure 4B:
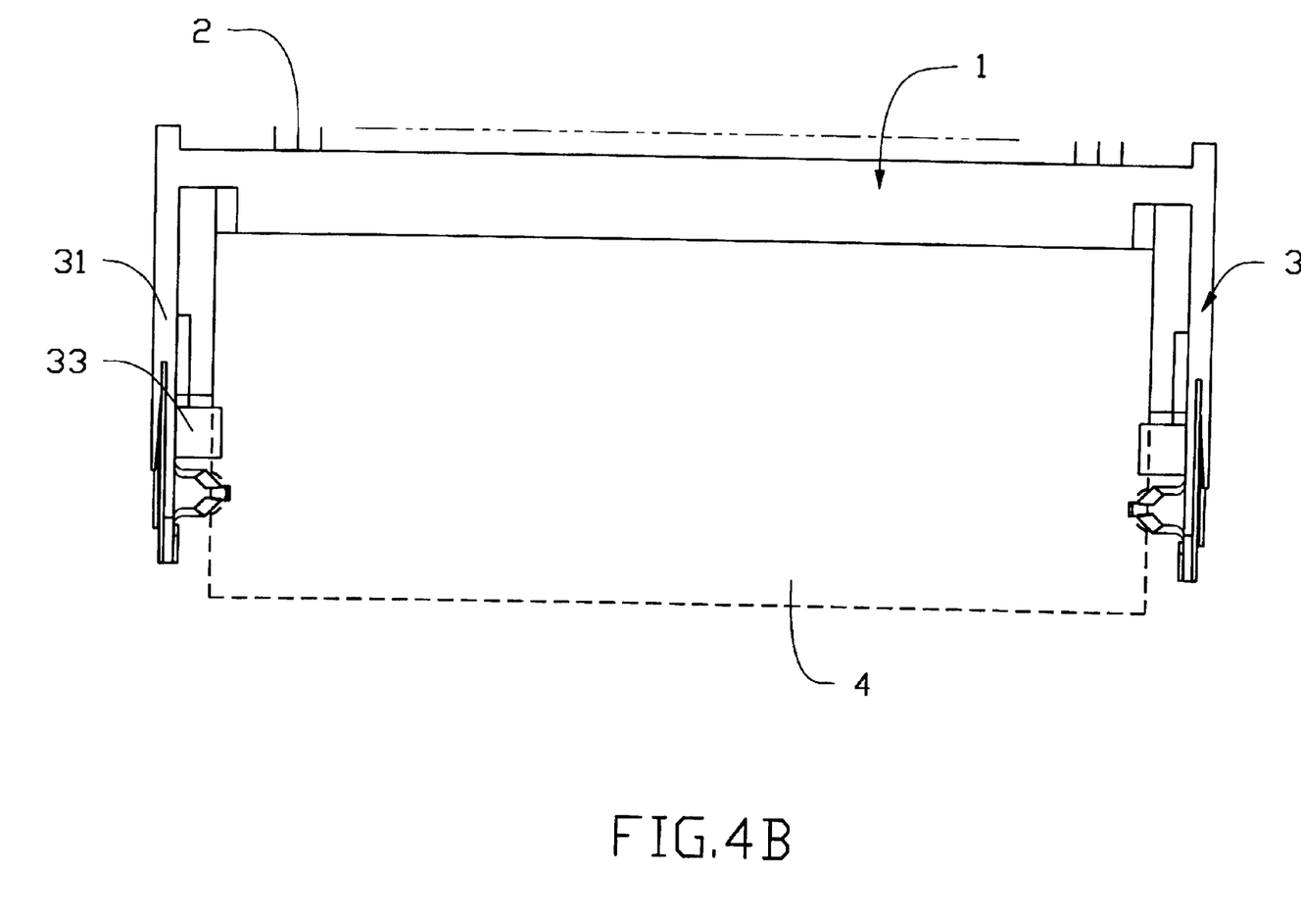
FIG. 4B is a top view of FIG. 1 showing a card fully inserted into the connector.

Referring to FIG. 4A, a daughter board 4 defining cutouts 41 in opposite lateral edges thereof is engaged with the housing 1 by inserting a front edge thereof into the slot 101. The daughter board 4 is rotated downward whereby an inner periphery of each cutout 41 slides along the inclined surface 3123 of the corresponding retainer 3121 causing the resilient portions 312 to move outward until the daughter board 4 is fully received in the slot 101 and supported by the supporting arms 310, and the curved walls 3125 are received in the corresponding cutouts 41 as seen in FIG. 4B.

To disengage the daughter board 4 from the connector 9 an outward force is exerted on each release pad 332. The resilient portions 312 can be moved outward to abut against the corresponding first stoppers 314. At this position, the embossments 3127 will abut against the corresponding second stoppers 350. The provision of the stoppers 314, 350 effectively prevents breakage of the resilient portions 312.

Figure 5:
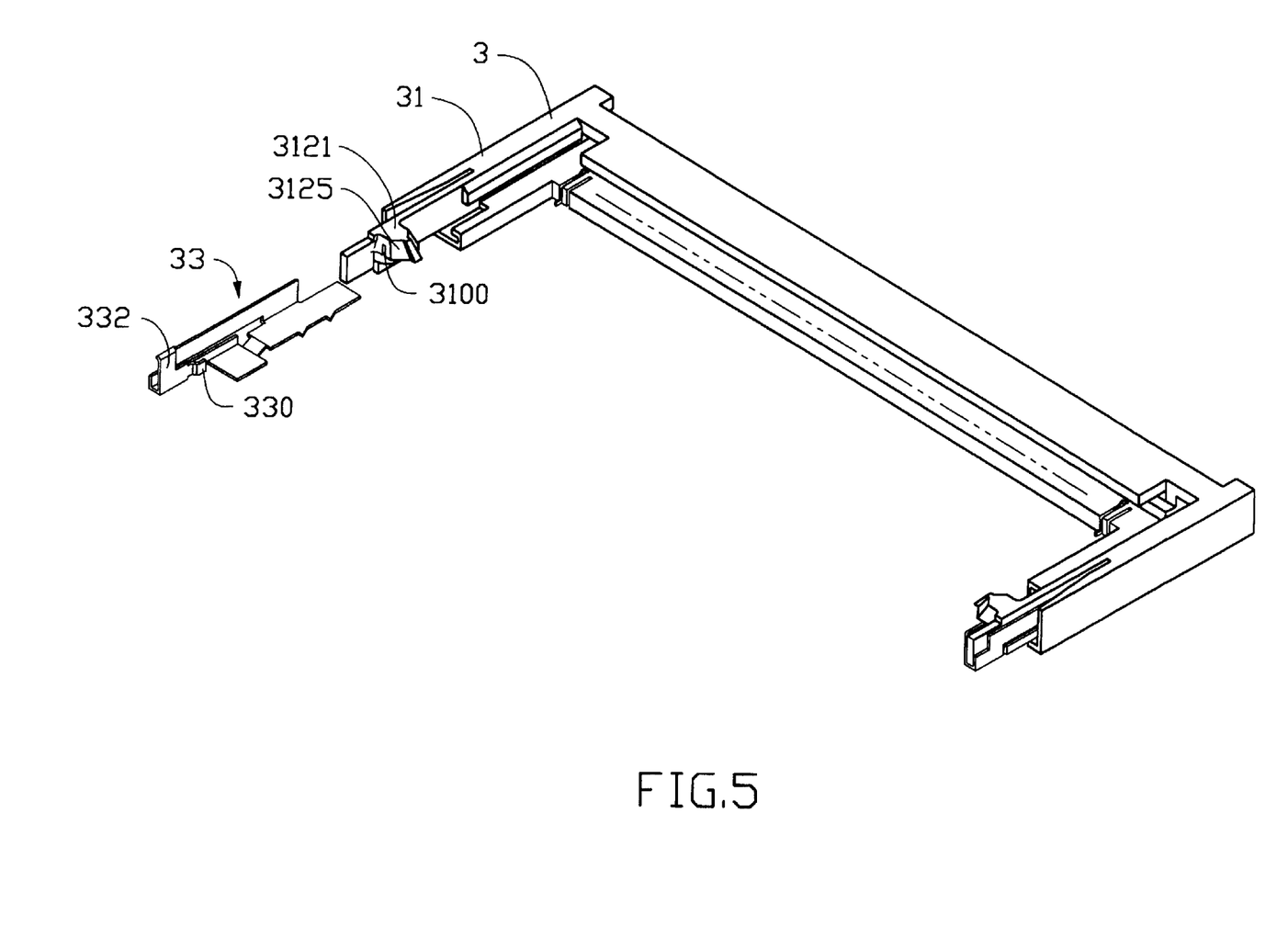
FIG. 5 is an exploded view of an electrical connector in accordance with a second embodiment of the present invention.

A second embodiment of the present invention as shown in FIG. 5 is similar to the first embodiment with engaging means provided for enhancing engagement between the retaining member 31 and the release member 33. The engaging means consists of a mounting portion 330 extending from the release pad 332 for engagement within an opening 3100 defined in the curved wall 3125.

Figure 6:
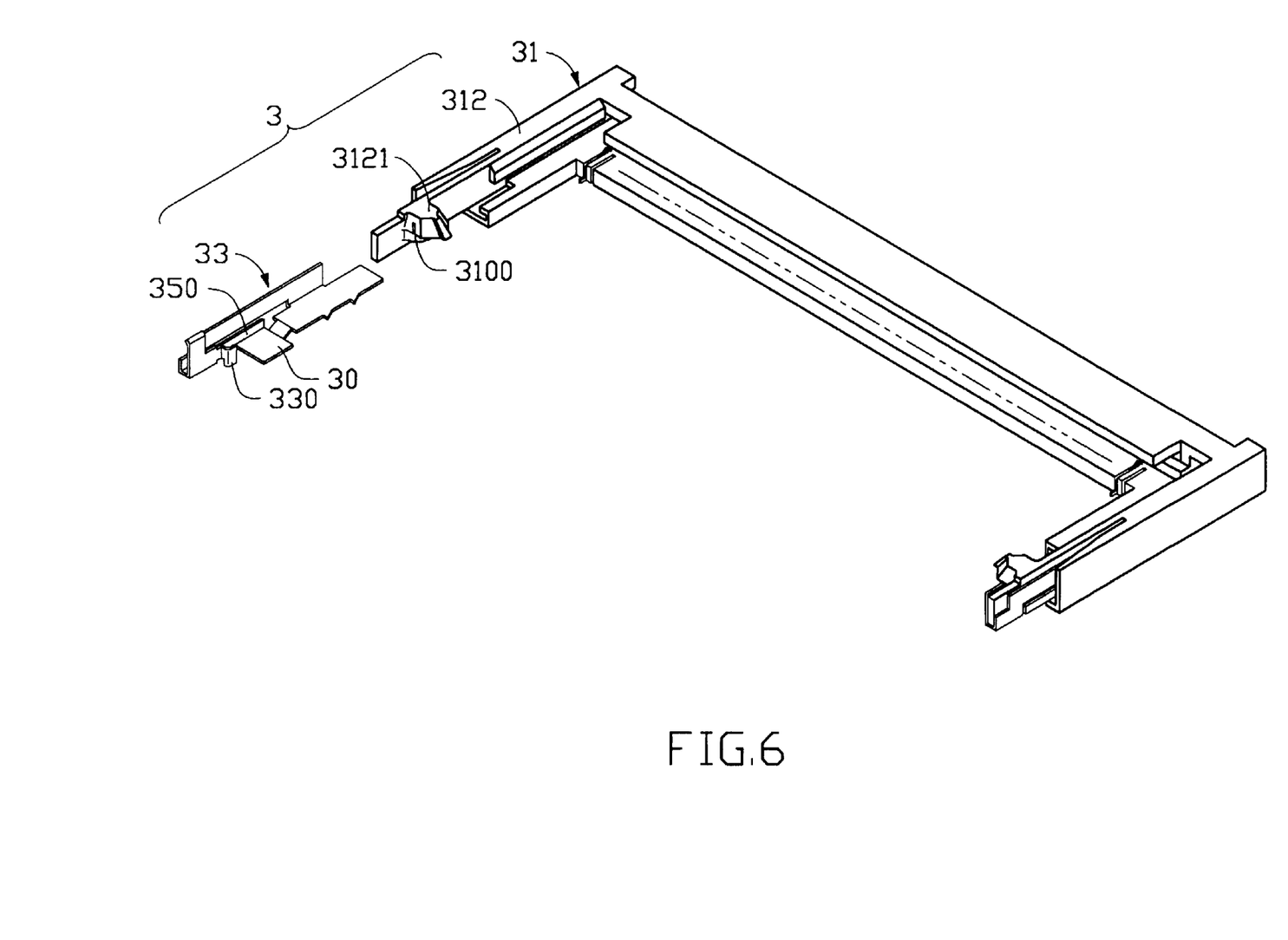
FIG. 6 is an exploded view of an electrical connector in accordance with a third embodiment of the present invention.

FIG. 6 shows a third embodiment of the present invention which is similar to the second embodiment except that the mounting portions 330 of the engaging means are larger and the embossment 3127 of each retainer 3121 is removed therefrom. When the resilient portions 312 are moved outward, the mounting portions 330 will abut against the corresponding second stoppers 350.

While the present invention has been described with reference to specific embodiments, the description is illustrative of the invention and is not to be construed as limiting the invention. Various modifications to the present invention can be made to the preferred embodiments by those killed in the art without departing from the true spirit and cope of the invention as defined by the appended claims.

What is claimed is:

1. An electrical connector for receiving a daughter board, comprising:

an elongate housing defining a slot therein;

a plurality of terminals received in passageways defined in the housing; and a pair of latching devices attached to opposite ends of the housing, each latching device including a plastic retaining member integrally formed with the housing and a metal release member assembled to the retaining member, each retaining member comprising a first stopper and a resilient portion, a groove defined between the first stopper and the resilient portion forming a retainer on an inner surface thereof, a curved wall below the retainer for engaging with cutouts defined in opposite lateral edges of the inserted daughter board, and an embossment downwardly extending from the curved wall, each release member comprising an elongate base abutting against the retaining member, a release pad extending from one end of the base for engaging with a free end of the retaining member, a reception plate perpendicularly extending from an opposite end of the base for reception in a channel defined in the retaining member, a positioning member connecting to the reception plate, and a second stopper extending from the positioning member;

whereby when an outward force is exerted on each release pad until the embossments of the retaining members abut against corresponding second stoppers of the release members and the resilient portions abut against corresponding first stoppers, the cutouts of the daughter board disengage from the curved walls of the corresponding retaining members to eject the inserted daughter board.

2. The connector as described in claim 1, wherein each retainer is provided with an inclined surface to facilitate engagement of the cutouts defined in lateral edges of the daughter board with the curved walls.

3. The connector as described in claim 1, wherein the retaining member of each latching device further comprises a horizontal supporting arm for supporting the daughter board.

4. The connector as described in claim 1, wherein the release pads are L-shaped.

5. The connector as described in claim 1, wherein the reception plate of each release member has barbs formed on outer edges thereof for engaging with recesses defined in the channel of the retaining member.

6. The connector as described in claim 1 further comprising engaging means for enhancing engagement between the retaining member and the release member, said engaging means comprising a mounting portion extending from the release pad of the release member for engagement within an opening defined in the curved wall of the retaining member.

7. An electrical connector for receiving a daughter board, comprising:

an elongate housing defining a slot therein;

a plurality of terminals received in passageways defined in the housing; and a pair of latching devices attached to opposite ends of the housing, each latching device including a plastic retaining member integrally formed with the housing and a metal release member assembled to the retaining member, each retaining member comprising a resilient portion forming retainer on an inner surface thereof, a first stopper, a groove defined between the resilient portion and the first stopper, and a curved wall below the retainer for engaging with cutouts defined in opposite lateral edges of the inserted daughter board, an embossment downwardly extending from the curved wall, each release member comprising an elongate base abutting against the retaining member, a release pad extending from one end of the base for engaging with a free end of the retaining member, a reception plate perpendicularly extending from an opposite end of the base for reception in a channel defined in the retaining member, a positioning member connecting to the reception plate, a second stopper extending from the positioning member, and a mounting portion extending from the release pad for engagement within an opening defined in the curved wall of the retaining member.

Whereby when an outward force is exerted on each release pad until the mounting portions abut against the second stoppers and the resilient portions abut against corresponding first stoppers, the cutouts of the daughter board disengage from the curved walls of the retaining members to eject the inserted daughter board.

8. The connector as described in claim 7, wherein each retainer is provided with an inclined surface to facilitate engagement of the cutouts of the daughter board with the curved walls.

9. The connector as described in claim 7, wherein the retaining member of each latching device further comprises a horizontal supporting arm for supporting an inserted card.

10. The connector as described in claim 7, wherein the release pads are L-shaped.

11. The connector as described in claim 7, wherein the reception plate of each release member has barbs formed on outer edges thereof for engaging with recesses defined in the channel of the retaining member.

12. A release member for engaging with a retaining member of latching means of a connector for releasably securing a daughter board to the connector mounted on a mother board, the connector having a retaining portion, comprising:

an elongate base;

a release pad extending from one end of the base for engaging with a free end of the retaining member of the connector;

a reception plate perpendicularly extending from an opposite end of the base for reception in a channel defined in the retaining member of the connector;

a positioning member connecting to the reception plate for soldering to the mother board; and a stopper extending from the positioning member for limiting movement of the retaining member of the connector thereby preventing breakage thereof.

13. The release member as described in claim 12, wherein the release member is stamped from a metal plate.

14. The release member as described in claim 12, wherein the release pads are L-shaped.

15. The release member as described in claim 12, wherein the reception plate has barbs formed on outer edges thereof for engaging with recesses defined in the channel of the retaining member of the connector.

16. The release member as described in claim 12, wherein a mounting portion extends from the release pad for engagement within an opening defined in the retaining member of the connector.

17. The release member as described in claim 16, wherein the mounting portion abuts against the stopper when the release member is moved outward a predetermined distance.

18. The release member as described in claim 12, wherein an inclined plate joins the reception plate to the positioning member.

* * * * *